United States Patent
Shih

(10) Patent No.: US 7,052,180 B2
(45) Date of Patent: May 30, 2006

(54) LED JUNCTION TEMPERATURE TESTER

(76) Inventor: Kelvin Shih, 908 Devonshire Blvd., Brighton, MI (US) 48116

( * ) Notice: Subject to any disclaimer, the term of this patent is extended or adjusted under 35 U.S.C. 154(b) by 75 days.

(21) Appl. No.: 10/337,246

(22) Filed: Jan. 6, 2003

(65) Prior Publication Data

US 2003/0133491 A1    Jul. 17, 2003

Related U.S. Application Data

(60) Provisional application No. 60/345,241, filed on Jan. 4, 2002.

(51) Int. Cl.
*G01K 15/00* (2006.01)
*G01K 7/01* (2006.01)
*G01J 5/20* (2006.01)

(52) U.S. Cl. .................. 374/178; 374/163; 374/183; 374/133; 374/1; 374/2

(58) Field of Classification Search ................ 374/163, 374/1, 178, 2, 133, 121, 183; 257/48; 327/108, 327/109; 315/291, 224, 185 R, 200 A
See application file for complete search history.

(56) References Cited

U.S. PATENT DOCUMENTS

| | | | | |
|---|---|---|---|---|
| 3,743,850 A | * | 7/1973 | Davis | 307/32 |
| 3,791,217 A | * | 2/1974 | Stout et al. | 374/167 |
| 3,924,470 A | * | 12/1975 | Sander | 374/179 |
| 3,926,052 A | * | 12/1975 | Bechtel | 73/335.05 |
| 4,055,166 A | * | 10/1977 | Simpson et al. | 600/549 |
| 4,282,753 A | * | 8/1981 | Davidson | 374/166 |
| 4,439,693 A | * | 3/1984 | Lucas et al. | 327/95 |
| 4,480,312 A | * | 10/1984 | Wingate | 702/130 |
| 4,807,482 A | * | 2/1989 | Park et al. | 73/862.68 |
| 5,206,778 A | * | 4/1993 | Flynn et al. | 361/103 |
| 5,401,099 A | * | 3/1995 | Nishizawa et al. | 374/178 |
| 5,708,471 A | * | 1/1998 | Okumura | 348/301 |
| 5,859,658 A | * | 1/1999 | Hammond | 347/238 |
| 5,982,221 A | * | 11/1999 | Tuthill | 327/512 |
| 6,008,685 A | * | 12/1999 | Kunst | 327/512 |
| 6,054,892 A | * | 4/2000 | Miles et al. | 327/512 |
| 6,149,299 A | * | 11/2000 | Aslan et al. | 374/178 |

(Continued)

FOREIGN PATENT DOCUMENTS

JP    2000304623 A  *  11/2000

*Primary Examiner*—Gail Verbitsky
(74) *Attorney, Agent, or Firm*—Carlson, Gaskey & Olds

(57) ABSTRACT

An instrument measures the LED junction temperature directly by taking advantage of the linear relationship between the forward current driven through the LED, the forward drop of the LED, and the junction temperature to determine the LED junction temperature.

Calibration is conducted by placing two LEDs from the same family in ambient temperature and passing a small test current through each of the LEDs to obtain the forward drop of the LED at ambient temperature. The LED under test is then placed in an environmentally-controlled chamber where the temperature is raised a known amount above ambient temperature. Known low and high voltage values are associated with the ambient temperature and the environmental chamber temperature, causing the LED under test becomes a calibrated thermometer that can measure its own junction temperature due to the linear relationship between the forward drop and the junction temperature.

17 Claims, 6 Drawing Sheets

U.S. PATENT DOCUMENTS

| | | |
|---|---|---|
| 6,280,081 B1 * | 8/2001 | Blau et al. ................... 374/1 |
| 6,554,469 B1 * | 4/2003 | Thomson et al. ........... 374/178 |
| 6,674,185 B1 * | 1/2004 | Mizuta ....................... 307/651 |
| 6,679,628 B1 * | 1/2004 | Breinlinger ................. 374/178 |
| 6,736,540 B1 * | 5/2004 | Sheehan et al. ............ 374/183 |
| 6,861,658 B1 * | 3/2005 | Fiset ........................ 250/504 R |
| 6,870,325 B1 * | 3/2005 | Bushell et al. .............. 315/224 |
| 2002/0062071 A1 * | 5/2002 | Diab et al. .................. 600/323 |
| 2005/0040773 A1 * | 2/2005 | Lebens et al. .............. 315/291 |
| 2005/0179035 A1 * | 8/2005 | Illegems et al. .............. 257/48 |

* cited by examiner

LED JUNCTION TEMPERATURE TESTER

REFERENCE TO RELATED APPLICATIONS

The present application claims priority to U.S. Provisional Patent Application No. 60/345,241, filed Jan. 4, 2002.

BACKGROUND OF THE INVENTION

High intensity LEDs are becoming more popular as light sources for traffic lights, automobile interior and exterior lighting, signboards, and other applications. The light output of a silicon LED chip is not only a function of the chip size and the process, but also a function of the junction temperature of the LED. By keeping the junction temperature low, LEDs can be driven with twice or three times as much current and, thus, generate twice or three times the light output while still extending the life of the LEDs. Currently, however, there is no instrument that can drive a LED at a given current and measure the corresponding junction temperature rise at the same time.

There is a desire for an instrument that can measure a relationship between LED junction temperature and drive current.

SUMMARY OF THE INVENTION

The present invention is directed to an instrument that can measure the LED junction temperature directly. With a simple calibration procedure for each family of LEDs, this instrument can read the temperature rise above the ambient in ° C. directly. The invention takes advantage of the linear relationship between the forward current driven through the LED, the forward drop of the LED, and the junction temperature to determine the LED junction temperature. When the junction temperature increases, the forward drop will decrease at a constant rate.

Calibration is conducted by placing two LEDs, a test LED and a reference LED from the same family in ambient temperature and passing a small test current through each of the LEDs. The test LED is then placed in an environmentally-controlled chamber where the temperature is raised a known amount above ambient temperature. Once the junction temperature of the LED is the same as the temperature in the environmental chamber, a gain potentiometer is adjusted so the digital voltmeter reads a known value and a potentiometer is locked, causing the LED under test becomes a calibrated thermometer that can measure its own junction temperature.

The measured forward drop of the LED at any given temperature minus the forward drop of this LED at ambient temperature (which is stored in the reference LED and the zero potentiometer) with an inverting amplifier stage will therefore provide a direct reading of the junction temperature rise. Since the test LED has already been calibrated in the environmental chamber, the digital voltmeter will read the junction temperature rise in ° C. directly.

DETAILED DESCRIPTION OF THE EMBODIMENTS

Figure 1:
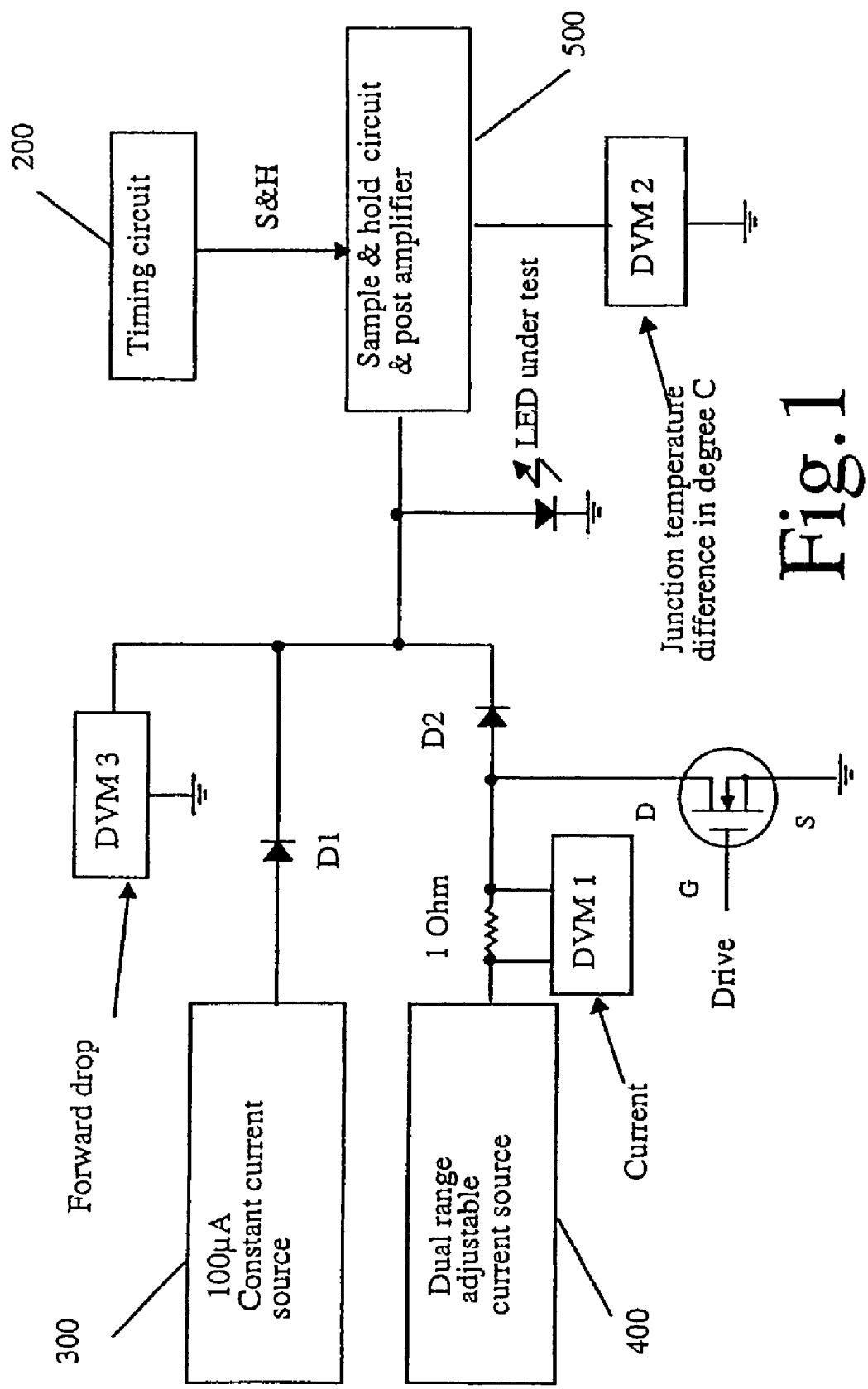
FIG. 1 is a block diagram illustrating a junction temperature measurement instrument according to one embodiment of the invention.

Generally, an LED junction temperature testing instrument according to the invention can read the temperature rise above the ambient in degrees C directly with a simple calibration procedure for a given LED family. In one embodiment, the forward drop of the LEDs can also be measured so that the calculation of the thermal resistance in ° C./watt can be done easily.

The forward drop of LED (light emitting diode) is function of the forward current as well as the junction temperature. When the drive current increases, the forward drop will also go up. When the junction temperature increases, the forward drop decreases at a constant rate. As is known in the art, the relationship between the temperature and forward drop in LEDs is linear over the operating temperature range. To measure the junction temperature of the LED, the drive current used should be small enough to minimize any self-heating effects in the LED.

To start the calibration process, the instrument drives a test LED and a reference LED from the same family and at the same ambient temperature with the same current. Both LEDs should have approximately the same forward drop when they are in the same ambient temperature and have the same current now through them. Any differences in the forward drops of the LEDs can be adjusted by using a zero potentiometer. This step basically stores the forward drop of the test LED in the reference LED forward drop and the zero potentiometer.

The test LED is then placed into an environmentally-controlled chamber having an adjustable temperature. The temperature in the chamber is then raised a known value (e.g., 50° C.) above the ambient temperature. Once the junction temperature of the test LED is the same as the temperature in the environmental chamber, a gain potentiometer is adjusted and locked so that the higher temperature corresponds with a known voltage. Because the low (ambient) junction temperature and the high (environmental chamber) junction temperature are known and because the low and high temperatures are tied to known low and high voltages, the linear characteristics of the LED's forward drop with respect to junction temperature allows the LED under test to act as a calibrated thermometer that can measure its own junction temperature.

A built-in timing circuit in the instrument directs the current flow through the LED under test. In one embodiment, during one cycle (0.1 second) a large preset drive current is flowing through the LED to heat it up 99% of the time, while there is a constant current of, for example, 100 uA flowing through the LED only 1% of the time during which the LED forward drop is measured.

The measured forward drop is stored in an analog memory so that information is available for the remainder of the cycle. This signal minus the forward drop of this LED at ambient temperature, which is stored in the reference LED and the zero potentiometer, with an inverting amplifier stage will give a direct reading of the junction temperature rise.

Because the LED has already been calibrated in the environmental chamber the digital voltmeter will indicate the junction temperature rise in ° C. directly.

The inventive instrument will be described in more detail below with reference to the Figures. Note that the specific values shown in the example below are for purposes of illustration only and are not meant to be limiting in any way. FIG. 1 is a block diagram of the instrument according to one embodiment of the invention. Block 300 is a constant current source (100 uA in this example). Block 400 is a dual range adjustable current source. This adjustable current source is used to supply the drive current of the LED. This current source is connected in series with a 1-ohm power resistor so digital voltmeter DVM1 can read the drive current.

Currents from the constant current source 300 and the adjustable current source 400 are added together using diodes D1 and D2. A N-channel MOSFET is connected between the anode of D2 and ground. This MOSFET is used to bypass or shunt the adjustable current to ground when its gate is high (12 V). When the calibrate/run switch in the timing circuit block 200 is in calibrate position, both the sample-and-hold signal and the drive signal to the gate of the MOSFET are high. The adjustable current will flow through the 1-ohm resistor and the MOSFET to ground.

Diode D2 is reverse biased, causing the test LED to have only 100 uA Flowing through it. At the same time, the sample-and-hold signal is also high; thus, the circuit in block 500 will constantly monitor the forward drop of the LED under test by measuring its forward drop at 100 uA.

When the calibrate/run switch is switched to the "run" position, the drive signal will be "off" for 99% of the time and "on" for 1% of the time, as noted above. When the MOSFET gate is "off", the drain source junction is open and the adjustable current source add to the 100 uA current source will flow through the LED under test. This will drive the LED to a selected brightness and heat the LED junction at the same time. When the gate of the MOSFET is high, the drain source junction will be a short circuit and only the 100 uA current will flow through the LED under test.

At approximately the same time, the sample-and-hold signal goes high and starts the sampling process in block 500. When the sample-and-hold signal and the drive signal to the MOSFET both become low, the hold circuit remembers the forward drop of the LED at 100 uA and ignores the forward drop of the LED under large current. By using a reference LED from the same family as the LED under test with a 100 uA drive current, most of the forward drop at ambient temperature will be cancelled out. The potentiometer zeroes out any voltage differences between the reference LED and the test LED, making the net voltage change read at DVM2 from the post amplifier in block 500 directly proportional to the temperature rise of the test LED junction above ambient temperature. A digital voltmeter DVM3 is placed directly across the test LED to measure the forward drop at that particular drive current.

Figure 2A:
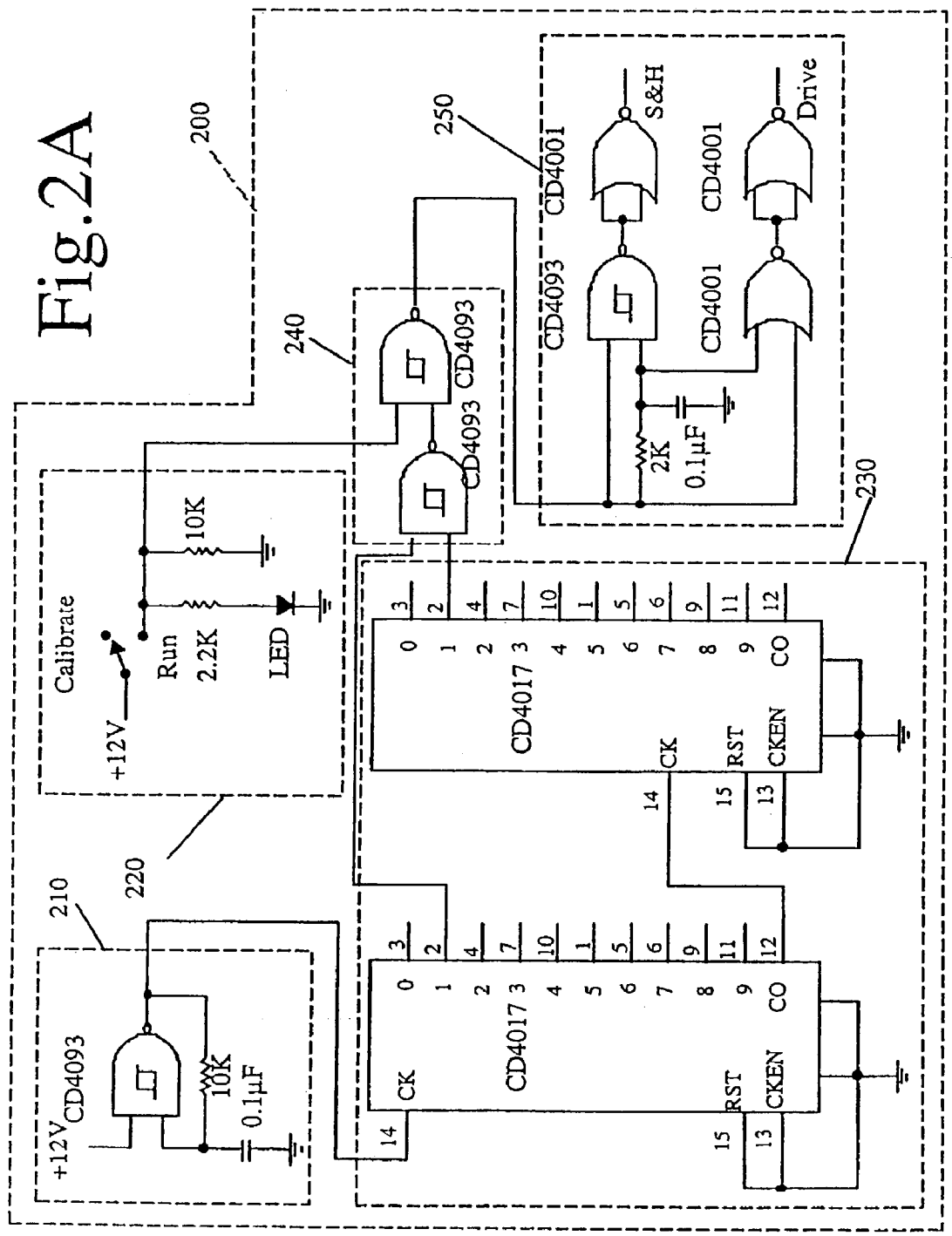
FIG. 2A is a schematic of a timing circuit according to one embodiment of the invention.

FIG. 2A is the timing circuit. This part gets its input from a calibrate/run switch, which dictates whether the instrument is in a calibration mode or a run mode. The oscillator 210 in this embodiment comprises a Schmidt trigger NAND gate and a 10K resistor and a 0.1 uF capacitor. With these values, the frequency of oscillation is approximately 1000 Hz. The switch block 220 in this embodiment comprises a single pole double throw switch, a 2.2 K resistor in series with a LED, and a 10K pull down resistor. This switch block will control the mode the tester is in. When the switch is at calibrate position, the output to the CD4093 input would be 0. And, when the switch is in run position, the LED will turn on and the output to the CD4093 in block 240 will be 1. The divider stage 230 takes in the 1000 Hz oscillating frequency of 1000 Hz, divides it by 10 in the first decade counter CD4017 and divides it again by 10 in the second decade counter CD4017. By ANDing the two outputs from each of the divider stages the output will be a 1% duty cycle pulse; in other words, out of every 100 ms period there is a 1 ms pulse.

When the switch block 220 is open (Calibrate position) the output to block 240 will be "0" (0 volt) and the output from block 240 to block 250 will be "1" (12 volt) all the time. When the switch in block 220 is closed, the output from block 220 will be "1" and the LED will be turned on. The output of block 240 will be a pulse train that has a duty cycle of 1%. This means the output will be "0" (0 volt) 99% of the time and "1" (12 volt) for 1% of the time. This pulse train goes to block 250 into a 2K-resistor and 0.1 uF capacitor (an RC circuit) in one branch and straight through, without encountering any circuit components, in a second branch. The RC circuit slightly delays the original signal while the second branch allows the original signal to travel through unimpeded and without any delay.

Figure 2B:
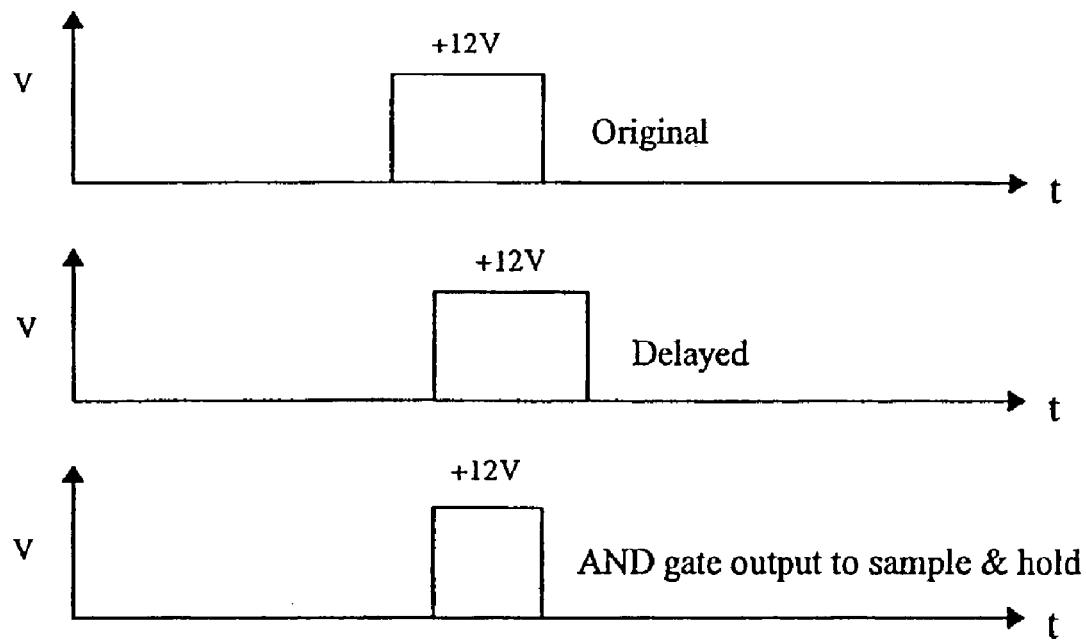
FIG. 2B is a timing diagram illustrating a relationship between signals in the timing circuit of FIG. 2A.

FIG. 2B shows how the original signal and the delayed signal fed to an AND gate generate a pulse that is slightly narrower than the original signal. This is because the output of the AND gate will only go high when both inputs become high. This happens when the delayed signal goes from low to high. The AND gate output will go low when any one of the two inputs go low (i.e., when the original signal goes low). This pulse is called an S/H pulse in this example and is used to drive the switch (CD4066) used in the sample-and-hold circuit. When this pulse is high, the switches are closed and the instrument samples the forward drop of the LED when there is only 100 uA going through the LED. When this pulse is low, the switch (CD4066) is off, placing the instrument in the hold mode to hold the voltage from the previously-sampled signal. This signal should be narrower than the pulse shown in FIG. 2C to prevent the sample-and-hold circuit from picking up any noise generated when the MOSFET is turning on or off.

Figure 2C:
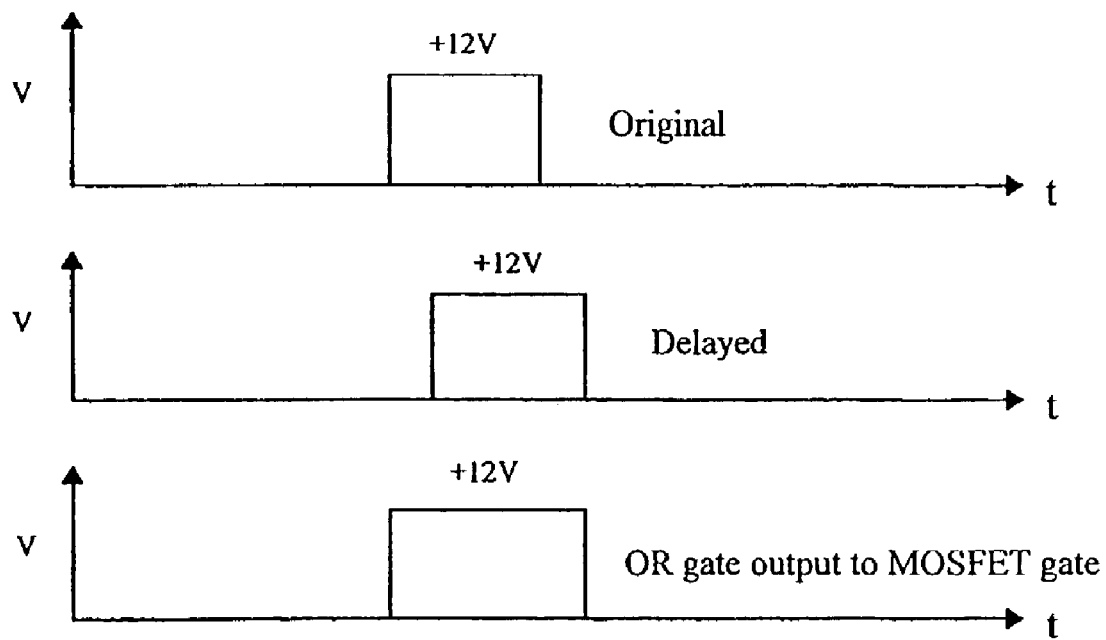
FIG. 2C is a timing diagram illustrating a relationship between additional signals in the timing circuit of FIG. 2A.

FIG. 2C shows how the original signal and the delayed signal fed to an OR gate generate a pulse that is slightly wider than the original signal. This is because the output of the OR gate will go high when any one of the two inputs become high. This happens when the original signal go from low to high. The OR gate output will go low when both inputs go low that is when the delayed signal go low. This signal is used to drive a power MOSFET switch to bypass the adjustable current source. When this signal is high, the current from the adjustable current source is bypass to ground and the only current go through the LED under test is 100 uA. When this pulse is low, the adjustable current source plus the 100 uA will go through the LED under test and thus heat up the LED. This pulse should be wider than the S/H pulse so the switching transients of the MOSFET do not interfere with the sample and hold circuit.

Figure 3:
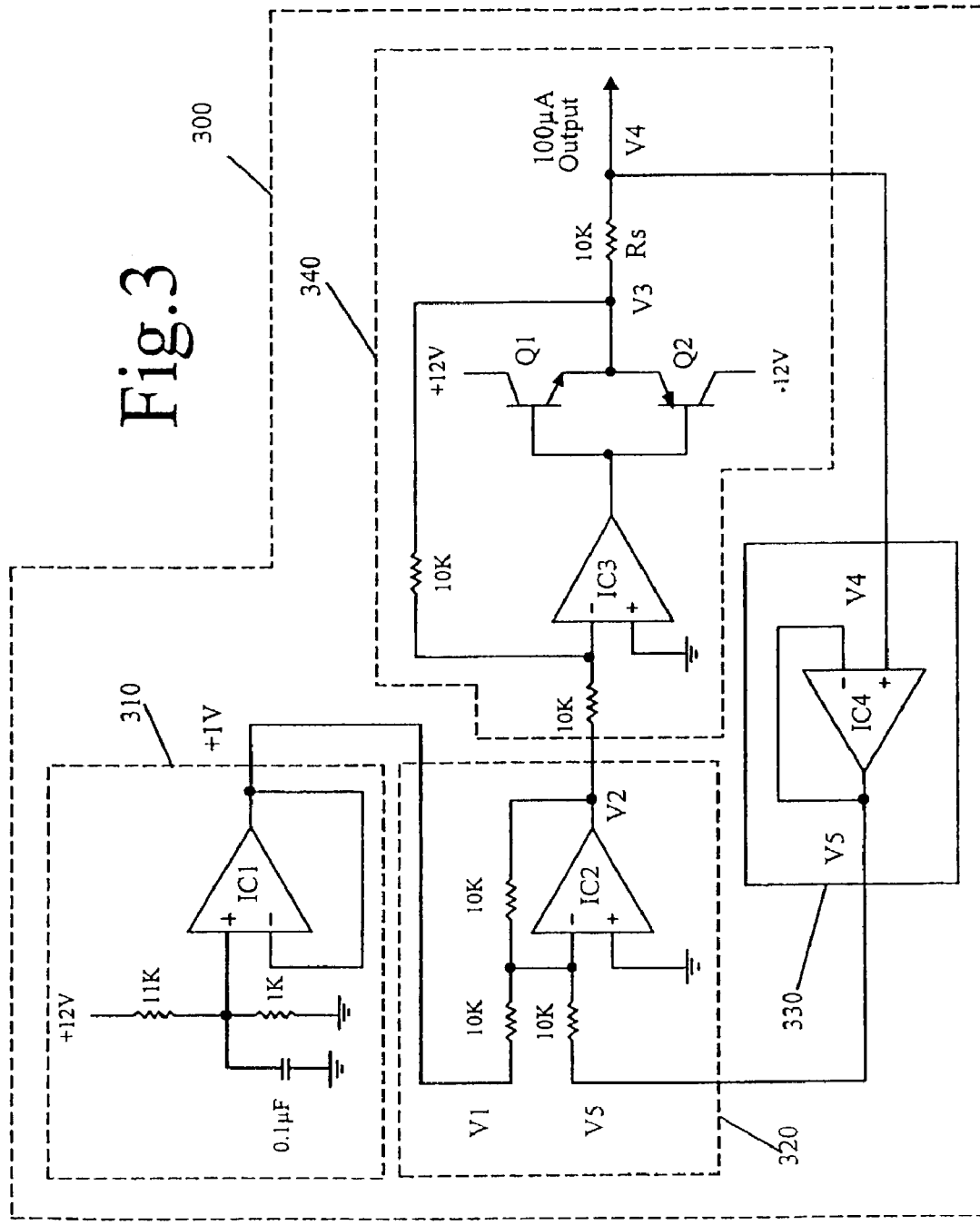
FIG. 3 illustrates a constant current source used in one embodiment of the inventive instrument.

FIG. 3 illustrates one example of a constant current source in the inventive instrument (100 uA in this example). Block 310 is a voltage divider and IC1 is an operational amplifier connected as a voltage follower. IC1 will have an output that is the same as the input voltage. Block 320 is an inverting summing amplifier with a gain of 1. Block 340 is an inverting amplifier with a gain of 1. The Q1 and Q2 transistors are used here to provide the current gain and isolate the IC3 operational from the switching noise of the MOSFET transistor. The output of this amplifier stage (block 330) is another voltage follower. The current flow through the Rs (10K) can be calculated as follows:

$$V2 = (V1 + V5)$$
$$V3 = V2 = (V1 + V5)$$
$$V4 = V5$$
$$I = \frac{V3 - V4}{10K} = \frac{(V1+V5)-V4}{10K} = \frac{(V1+V4)-V4}{10K} = \frac{V1}{10K}$$
Since $V1 = 1$
$$I = \frac{1}{10K} = 100 \text{ uA}$$

Figure 4:
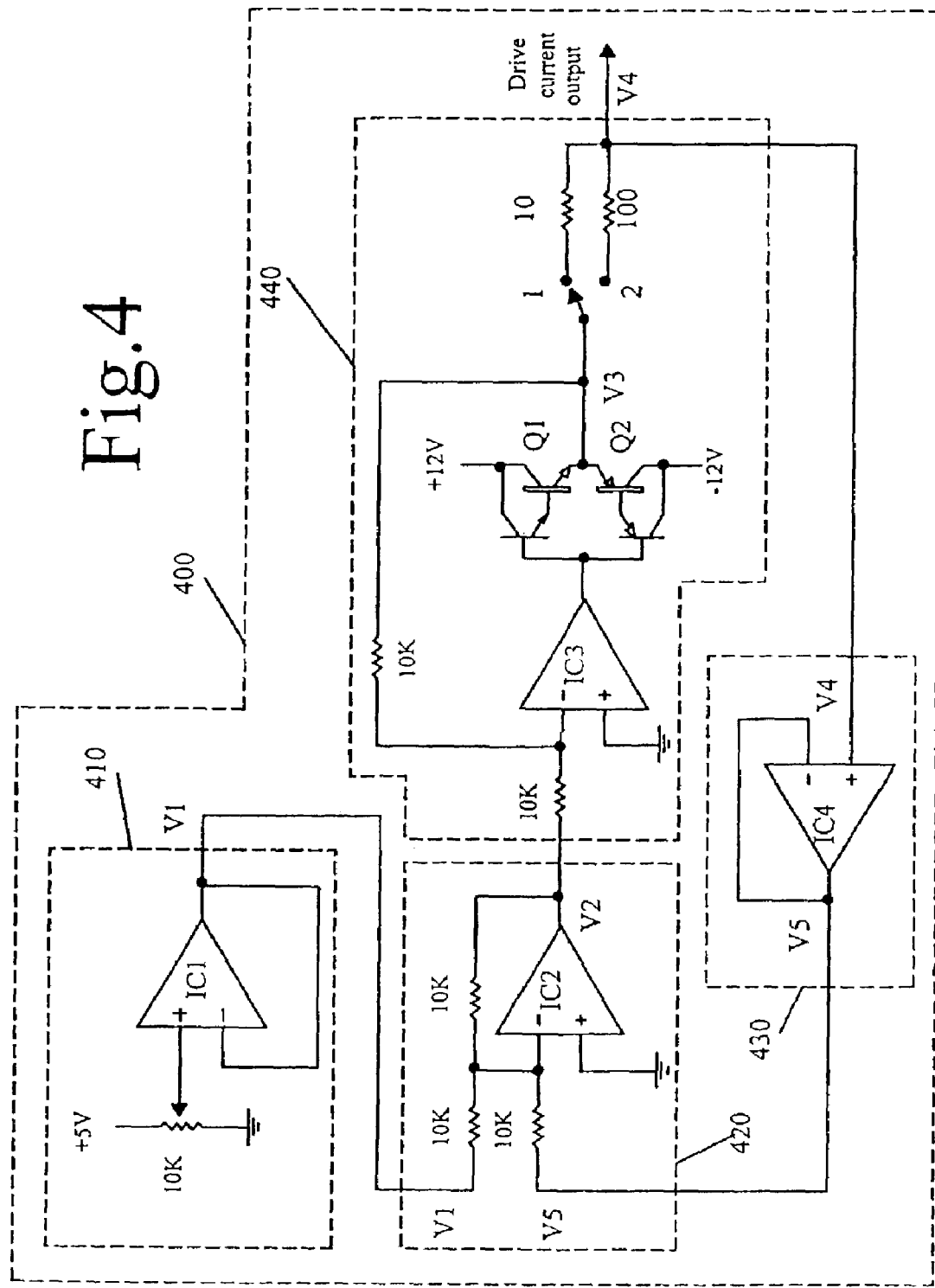
FIG. 4 illustrates an adjustable current source used in one embodiment of the inventive instrument.

FIG. 4 illustrates the adjustable current source 400 in more detail. In this embodiment, the adjustable current source 400 is adjustable in a first range (when the switch in block 440 is at position 1) from 0 to 500 mA and in a second range (when the switch is in position 2) from 0 to 50 mA. Block 410 is a voltage divider using a 10K potentiometer. IC1 is an operational amplifier connected as a voltage follower. and therefore the output of IC1 will be the same as the input voltage. Block 420 is an inverting summing amplifier with a gain of 1 and contains an operational amplifier IC2 and three 10K resistors. Block 440 is an inverting amplifier with a gain of 1. The Q1 and Q2 transistors are used here to provide the current gain and isolate the IC3 operational amplifier from the switching noise of the MOSFET transistor. The output of this amplifier stage (block 430) is another voltage follower. The current flow through the Rs can be calculated as follows:

$$V2 = -(V1 + V5)$$
$$V3 = -V2 = (V1 + V5)$$
$$V4 = V5$$
$$I = \frac{V3 - V4}{Rs} = \frac{(V1+V5)-V4}{Rs} = \frac{(V1+V4)-V4}{Rs} = \frac{V1}{Rs}$$

Since V1=0 to 5V

At switch position 1, Rs=10.

$$I = \frac{V1}{Rs} = \frac{V1}{10}$$

The current I=0 to 500 mA.

At switch position 2, Rs=100.

$$I = \frac{V1}{Rs} = \frac{V1}{100}$$

The current I=0 to 50 mA.

Figure 5:
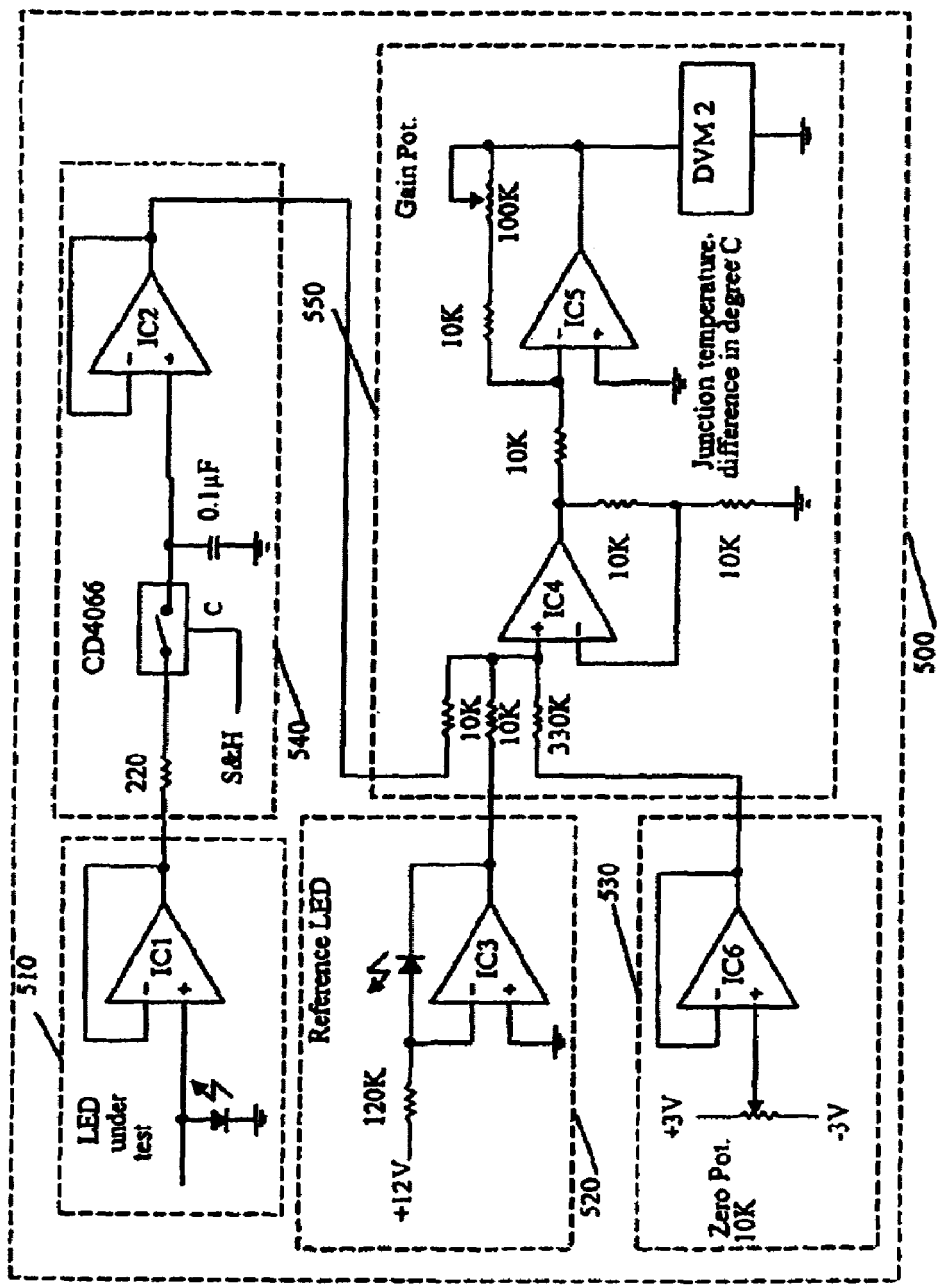
FIG. 5 illustrates a signal processing stage used in one embodiment of the inventive instrument.

FIG. 5 illustrates the final stage of the signal processing. Block 510 comprises IC1 connected as a voltage follower to buffer the voltage drop information of the test LED. Block 520 is a constant current source of 100 uA and buffer for the reference LED. At operational amplifier IC3, the output is a negative voltage equal to the reference LED forward drop at 100 uA. Block 530 is used to zero the difference in the forward drop between the reference LED and the LED under test and comprises a 10K potentiometer and a voltage follower IC3. Block 540 is the sample and hold stage. IC2 is connected as a voltage follower so when CD4066 switch is open, the charge that is trapped in the capacitor cannot discharge. This circuit is used to sample the forward drop of the LED under test when the MOSFET bypasses the large drive current and only 100 uA drive current is sent through the LED. The CD4066 switch is controlled by the S/H signal from FIG. 2A. Since the drive signal bypassing the large current is wider than the S/H signal, the entire transient has been passed or yet to happen when the sampling is done. The output of this stage is the forward drop change of the LED under test. Block 550 is the post amplifier that allows zeroing out of the difference the forward drop between the reference LED and the LED under test. Also, one stage of adjustable gain amplifier gives a direct reading in ° C. of the temperature rise.

Operational amplifier IC4 is connected as a non-inverting summing amplifier. This stage adds the forward drop of the LED under test, the negative forward drop from the reference LED and a zeroing signal from block 530. When the calibrate/run switch is in a calibration mode, both LEDs will have 100 uA flowing through them. With the fine adjustment of the zero potentiometer, the output to DVM2 will be zero. When the calibrate/run switch is switched to run position, the test LED will have a preset amount of current flow through it and started to heat up and the output from the sample and hold stage will start to drop. The output of IC4 will become negative and the output to DVM2 will start to increase. If the reference LED and the test LED belong to the same family and the test LED has been tested during the calibration cycle, the output of IC5 to DVM2 can read ° C. directly with better than 0.5° C. accuracy.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A test instrument for measuring a junction temperature of an LED, comprising:
    an interface that holds a test LED and a reference LED;
    a first current source that sends a fixed current through the test LED and the reference LED during a calibration mode;
    a second current source that sends an adjustable drive current through the test LED during a run mode; and
    a differential meter that measures a difference between a forward drop of the test LED when the adjustable drive current goes through the test LED and a forward drop of the test LED at ambient temperature to cause the test LED to serve as its own temperature sensor.

2. The test instrument of claim 1, further comprising a switch that bypasses the second current source during the calibration mode and connects the second current source to the test LED during the run mode.

3. The test instrument of claim 2, wherein the switch operates such that the fixed current goes through the test LED during the calibration mode and the fixed current and the adjustable drive current go through the test LED during the run mode.

4. The test instrument of claim 2, further comprising a timing circuit that generates a duty cycle pulse to control the switch.

5. The test instrument of claim 4, wherein the timing circuit generates a sample and hold pulse based on the duty cycle pulse, and wherein the test instrument further comprises a sample and hold circuit driven by the sample and hold pulse to operate the sample and hold circuit during the run mode, wherein the sample and hold circuit samples and holds the forward drop of the test LED during the run mode.

6. The test instrument of claim 5, wherein the sample and hold pulse is shorter than the duty cycle pulse.

7. The test instrument of claim 4, wherein to timing circuit generates a drive pulse that is longer than to duty cycle pulse to drive the switch.

8. The test instrument of claim 1, wherein the fixed current is sent through the reference LED as the fixed current and the adjustable drive current are sent through the test LED during the run mode.

9. The test instrument of claim 1, further comprising a potentiometer to eliminate a forward drop difference between the test LED and the reference LED during the calibration mode.

10. The test instrument of claim 1, further comprising:
   an inverting summing amplifier to convert an output of the differential meter to a temperature reading reflecting to junction temperature of the tested LED; and
   a display coupled to the inverting summing amplifier to display the temperature reading.

11. A test instrument for measuring a junction temperature of an LED, comprising:
   an interface that holds a test LED and a reference LED;
   a first current source that sends a fixed current through the test LED and the reference LED during a calibration mode;
   a second current source that sends an adjustable drive current through the test LED during a run mode;
   a switch that bypasses the second current source during the calibration mode such that the first drive current goes through the test LED during the calibration mode and the fixed current and the adjustable current go through the test LED during the run mode;
   a sample and hold circuit that samples and holds the junction temperature of the test LED during the run mode;
   a differential meter that measures a difference between a forward drop of the test LED when the adjustable drive current goes through the test LED and a forward drop of the test LED at ambient temperature to cause the test LED to serve as its own temperature sensor; and
   a display coupled to an inverting summing amplifier to display at least one of difference measured by the differential meter and a temperature reading.

12. The test instrument of claim 11, further comprising a timing circuit that generates a duty cycle pulse to control the switch.

13. The test instrument of claim 12, wherein the timing circuit generates a sample and hold pulse based on the duty cycle pulse, wherein the sample and hold pulse drives the sample and hold circuit.

14. The test instrument of claim 13, wherein the sample and hold pulse is shorter than the duty cycle pulse.

15. The test instrument of claim 12, wherein the timing circuit generates a drive pulse that is longer than the duty cycle pulse to drive the switch.

16. The test instrument of claim 11, wherein the fixed current is sent through the reference LED as the fixed current and the adjustable drive current are sent through the test LED during the run mode.

17. The test instrument of claim 11, further comprising a potentiometer to eliminate a forward drop difference between the test LED and the reference LED during the calibration mode.

* * * * *

UNITED STATES PATENT AND TRADEMARK OFFICE
CERTIFICATE OF CORRECTION

| | | |
|---|---|---|
| PATENT NO. | : 7,052,180 B2 | Page 1 of 1 |
| APPLICATION NO. | : 10/337246 | |
| DATED | : May 30, 2006 | |
| INVENTOR(S) | : Shih | |

It is certified that error appears in the above-identified patent and that said Letters Patent is hereby corrected as shown below:

In Column 7:
Claim 7, Line 10 of the issued patent, "to" should read as --the--.
Claim 7, Line 11 of the issued patent, "to" should read as --the--.
Claim 10, Line 24 of the issued patent, "to" should read as --the--.

Signed and Sealed this

Fifth day of September, 2006

JON W. DUDAS
*Director of the United States Patent and Trademark Office*